United States Patent

Goda

(10) Patent No.: US 9,356,251 B2
(45) Date of Patent: May 31, 2016

(54) LIGHT-EMITTING DEVICE INCLUDING A FIRST RESISTANCE LAYER WITH A CREEPING-UP PORTION

(75) Inventor: Tadashi Goda, Ibaraki (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 13/580,777

(22) PCT Filed: Feb. 21, 2011

(86) PCT No.: PCT/JP2011/053693
§ 371 (c)(1),
(2), (4) Date: Sep. 7, 2012

(87) PCT Pub. No.: WO2011/105330
PCT Pub. Date: Sep. 1, 2011

(65) Prior Publication Data
US 2013/0001607 A1   Jan. 3, 2013

(30) Foreign Application Priority Data

Feb. 25, 2010 (JP) ................................. 2010-039992

(51) Int. Cl.
*H01L 29/18* (2006.01)
*H01L 33/00* (2010.01)
(Continued)

(52) U.S. Cl.
CPC ........ *H01L 51/5088* (2013.01); *H01L 51/5096* (2013.01); *H01L 27/3246* (2013.01); *H01L 27/3283* (2013.01)

(58) Field of Classification Search
USPC .................................................... 257/88, 89
See application file for complete search history.

(56) References Cited

U.S. PATENT DOCUMENTS 8,628,986 B2    1/2014   Amamiya et al.
2004/0012330 A1*  1/2004   Ohshita et al. ................ 313/504
(Continued)

FOREIGN PATENT DOCUMENTS

JP    2008-192311 A    8/2008
JP    2008-235011 A    10/2008
(Continued)

OTHER PUBLICATIONS

International Search Report for PCT/JP2011/053693, dated May 24, 2011.
(Continued)

*Primary Examiner* — Mohammad Islam
*Assistant Examiner* — Jay C Chang
(74) *Attorney, Agent, or Firm* — Sughrue Mion, PLLC

(57) ABSTRACT

Light-emitting device including a supporting substrate, a partition wall dividing a plurality of EL elements on the supporting substrate, and the EL elements provided in a concave portion that is a space between the partition walls. Each EL element is constituted by a first electrode, a first resistance layer formed by an applying method, a second resistance layer having an electric resistance higher than that of the first resistance layer, a light-emitting layer, and a second electrode in this order so that the first electrode is located near the supporting substrate. The first resistance layer includes a creeping-up portion creeping up to a direction that is away from the supporting substrate and along the surface of the corresponding partition wall; and the second resistance layer is provided by ranging continuously over one EL element to another EL element that are adjacent to each other with the partition wall interposed therebetween.

4 Claims, 3 Drawing Sheets

(51) Int. Cl.
*H01L 29/00* (2006.01)
*H01L 51/50* (2006.01)
*H01L 27/32* (2006.01)

(56) References Cited

U.S. PATENT DOCUMENTS

| | | | | |
|---|---|---|---|---|
| 2006/0290274 A1* | 12/2006 | Oota | | 313/506 |
| 2007/0096637 A1* | 5/2007 | Kim | | 313/503 |
| 2007/0102737 A1* | 5/2007 | Kashiwabara et al. | | 257/291 |
| 2008/0142807 A1* | 6/2008 | Choe et al. | | 257/72 |
| 2009/0108743 A1* | 4/2009 | Kobayashi | | 313/504 |
| 2009/0253223 A1 | 10/2009 | Gohda et al. | | |

FOREIGN PATENT DOCUMENTS

| | | |
|---|---|---|
| JP | 2009-238708 A | 10/2009 |
| WO | 2006/085615 A1 | 8/2006 |
| WO | 2009017026 A1 | 2/2009 |

OTHER PUBLICATIONS

Office Action issued Nov. 4, 2014 in corresponding Chinese Patent Application No. 201180010703.7 with English Translation.

* cited by examiner

LIGHT-EMITTING DEVICE INCLUDING A FIRST RESISTANCE LAYER WITH A CREEPING-UP PORTION

CROSS REFERENCE TO RELATED APPLICATIONS

This application is a National Stage of International Application No. PCT/JP2011/053693 filed on Feb. 21, 2011, which claims priority from Japanese Patent Application No. 2010-039992, filed on Feb. 25, 2010, the contents of all of which are incorporated herein by reference in their entirety.

TECHNICAL FIELD

The present invention relates to a light-emitting device and a production method thereof.

BACKGROUND ART

Display devices include various types such as a liquid crystal display device and a plasma display device. As one type of these display devices, a display device using, as the light source of a pixel, organic electroluminescent elements (organic EL elements) has come to be put into practical use.

This type of display device includes a plurality of organic EL elements arrayed on a substrate. On the substrate, partition walls for dividing organic EL elements are disposed in a lattice pattern or a stripe pattern. Each organic EL element is provided in a region divided by the substrate and the partition wall. For example, when a plurality of partition walls are provided in a stripe pattern on the supporting substrate, each of the organic EL elements is arrayed in each space between the partition walls (also called a "concave portion"), and the organic EL elements that are arrayed respectively in a space between the partition walls are arrayed at a predetermined interval along an extending direction of the partition wall. In other words, the organic EL elements are arrayed in a matrix pattern. Further, for example, when the partition wall in a lattice pattern is provided on the supporting substrate, each organic EL element is arrayed in a region divided into a substantially rectangular shape by a lattice-patterned partition wall.

Referring to FIG. 3, the composition of a conventional light-emitting device is described. FIG. 3 is a view schematically illustrating a light-emitting device provided with a plurality of organic EL elements.

The organic EL element is composed by including a pair of electrodes and a plurality of predetermined layers provided between the electrodes. As the predetermined layer, the organic EL element includes at least one light-emitting layer. As illustrated in FIG. 3, the organic EL element is composed by stacking an anode 2, a hole injection layer 3, a hole transport layer 4, a light-emitting layer 5, and a cathode 6 in this order on a supporting substrate 1 so that the anode 2 is located near the supporting substrate 1.

The above-described predetermined layer can be formed by an applying method. For example, the hole injection layer 3 can be formed by supplying an ink including a material to be the hole injection layer to a region (concave portion) divided by a partition wall 7, and solidifying the ink. Thus, when the hole injection layer 3 is formed by the applying method, the supplied ink could be solidified while remaining wet-spread on a side face of the partition wall 7 in some cases. That is, as illustrated in FIG. 3, on the periphery of the hole injection layer 3 provided in the concave portion, a creeping-up portion 3a creeping up toward a direction that is away from the supporting substrate 1 could be formed along a side face of the partition wall 7 in some cases. When forming sequentially a hole transport layer 4, a light-emitting layer 5 and a cathode 6 on the hole injection layer 3 having such a creeping-up portion 3a, the creeping-up portion 3a and the cathode 6 could be physically connected with each other in some cases.

A material frequently used at present for the hole injection layer 3 has relatively low electric resistance. Therefore, when the creeping-up portion 3a and the cathode 6 are physically connected with each other, the cathode 6 and the anode 2 become electrically connected with each other through the creeping-up portion 3a, and as the result, a leakage current may be generated. A countermeasure for preventing the generation of such leakage current has been studied (for example, see Patent Literature 1). However, this countermeasure cannot necessarily be practical, so the improvement is desired.

RELATED ART DOCUMENTS

Patent Literature

Patent Document 1: JP 2008-192311

DISCLOSURE OF INVENTION

Problem to be Solved by the Invention

Accordingly, it is an object of the present invention to provide a light-emitting device provided with an organic EL element capable of preventing the generation of a leakage current.

The present invention provides [1] to [4] below.

[1] A light-emitting device comprising:
a supporting substrate;
a partition wall for dividing a plurality of organic electroluminescent elements on the supporting substrate; and
a plurality of organic electroluminescent elements provided in a concave portion that is a space between the partition walls,
wherein each of the organic electroluminescent elements is composed by disposing a first electrode, a first resistance layer, a second resistance layer having an electric resistance higher than that of the first resistance layer, a light-emitting layer and a second electrode, in this order so that the first electrode is located near the supporting substrate;
the first resistance layer comprises a creeping-up portion creeping up to a direction that is away from the supporting substrate and along a surface of the partition wall; and
the second resistance layer is provided so as to straddle continuously over one organic electroluminescent element to another organic electroluminescent element that are adjacent to each other with the partition wall interposed therebetween.

[2] A method for producing a light-emitting device comprising a supporting substrate, a partition wall for dividing a plurality of organic electroluminescent elements on the supporting substrate, and a plurality of organic electroluminescent elements provided in a concave portion that is a space between the partition walls, each of the organic electroluminescent elements comprising a first electrode, a first resistance layer, a second resistance layer having an electric resistance larger than that of the first resistance layer, a light-emitting layer and a second electrode that are disposed in this order so that the first electrode is located near the supporting substrate, the method comprising the steps of:
preparing the supporting substrate provided with the partition wall and the first electrode;

forming the first resistance layer, by supplying an ink comprising a material to be the first resistance layer to the concave portion and solidifying the ink;

forming the second resistance layer, by supplying an ink comprising a material to be the second resistance layer to all regions in which the organic electroluminescent elements are to be formed so that the ink straddles over all the regions and solidifying the ink;

forming the light-emitting layer; and forming the second electrode.

[3] The method for producing the light-emitting device according to claim 2, wherein the step of forming the first resistance layer is performed by a nozzle printing method.

Effect of Invention

According to the present invention, a light-emitting device provided with an organic EL element in which generation of leakage current is suppressed, can be obtained.

DESCRIPTION OF EMBODIMENTS

A light-emitting device according to an embodiment of the present invention is a light-emitting device provided with a supporting substrate, a partition wall for dividing a plurality of organic EL elements on the supporting substrate and a plurality of organic EL elements each of which is provided in a concave portion that is a space between the partition walls, wherein: each organic EL element is composed by disposing a first electrode, a first resistance layer, a second resistance layer having an electric resistance higher than that of the first resistance layer, a light-emitting layer and a second electrode in this order so that the first electrode is located near the supporting substrate; the first resistance layer includes a creeping-up portion creeping-up to a direction that is away from the supporting substrate and along the surface of the corresponding partition wall; and the second resistance layer is provided so as to straddle continuously over one organic EL element to another organic EL element that are adjacent to each other with the partition wall interposed therebetween.

The light-emitting device is utilized, for example, as a display device. In the display device, there are mainly an active matrix driven-type and a passive matrix driven-type. Although the present invention can be applied to both types of display devices, in the present embodiment, as one example, a light-emitting device applied to an active matrix driven-type display device is described.

<Composition of Light-Emitting Device>

Figure 1:
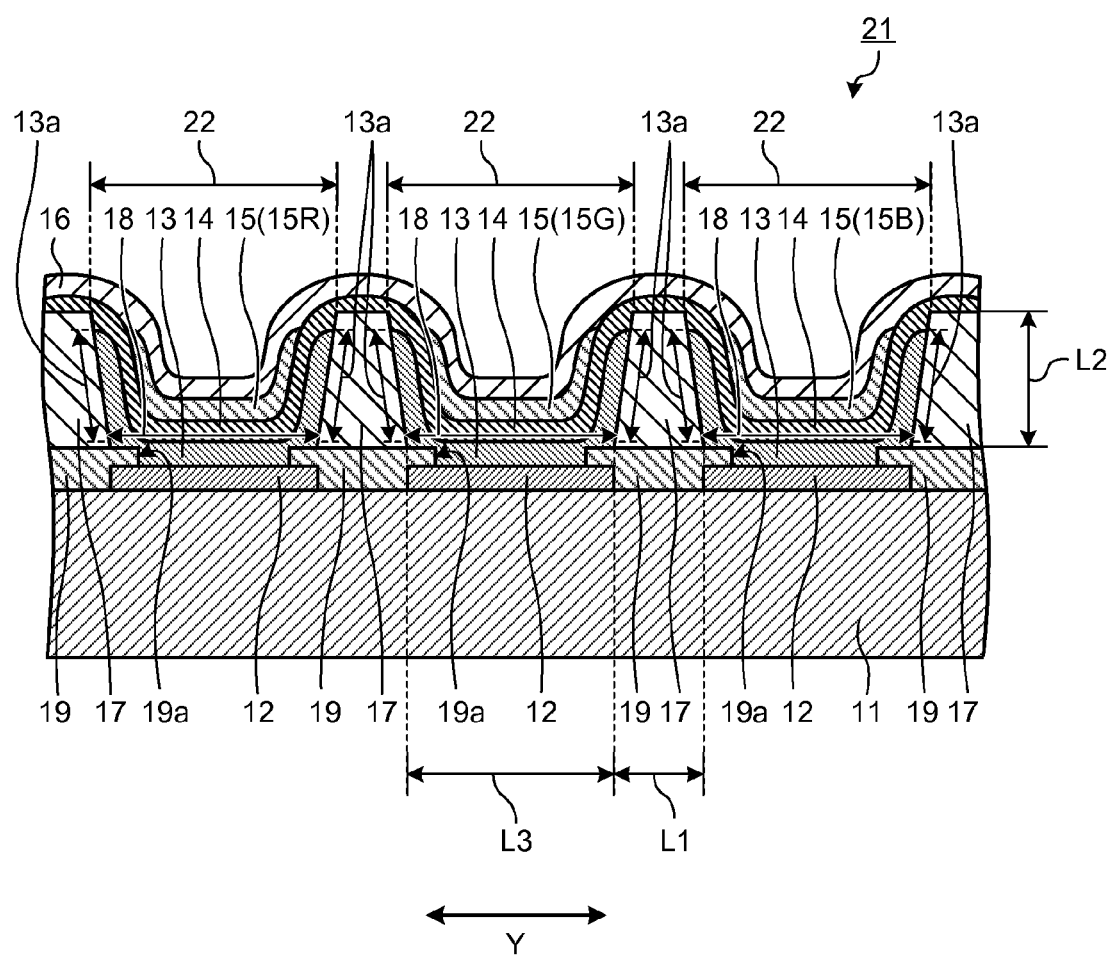
FIG. 1 is a cross-sectional view schematically illustrating a light-emitting device.
Figure 2:
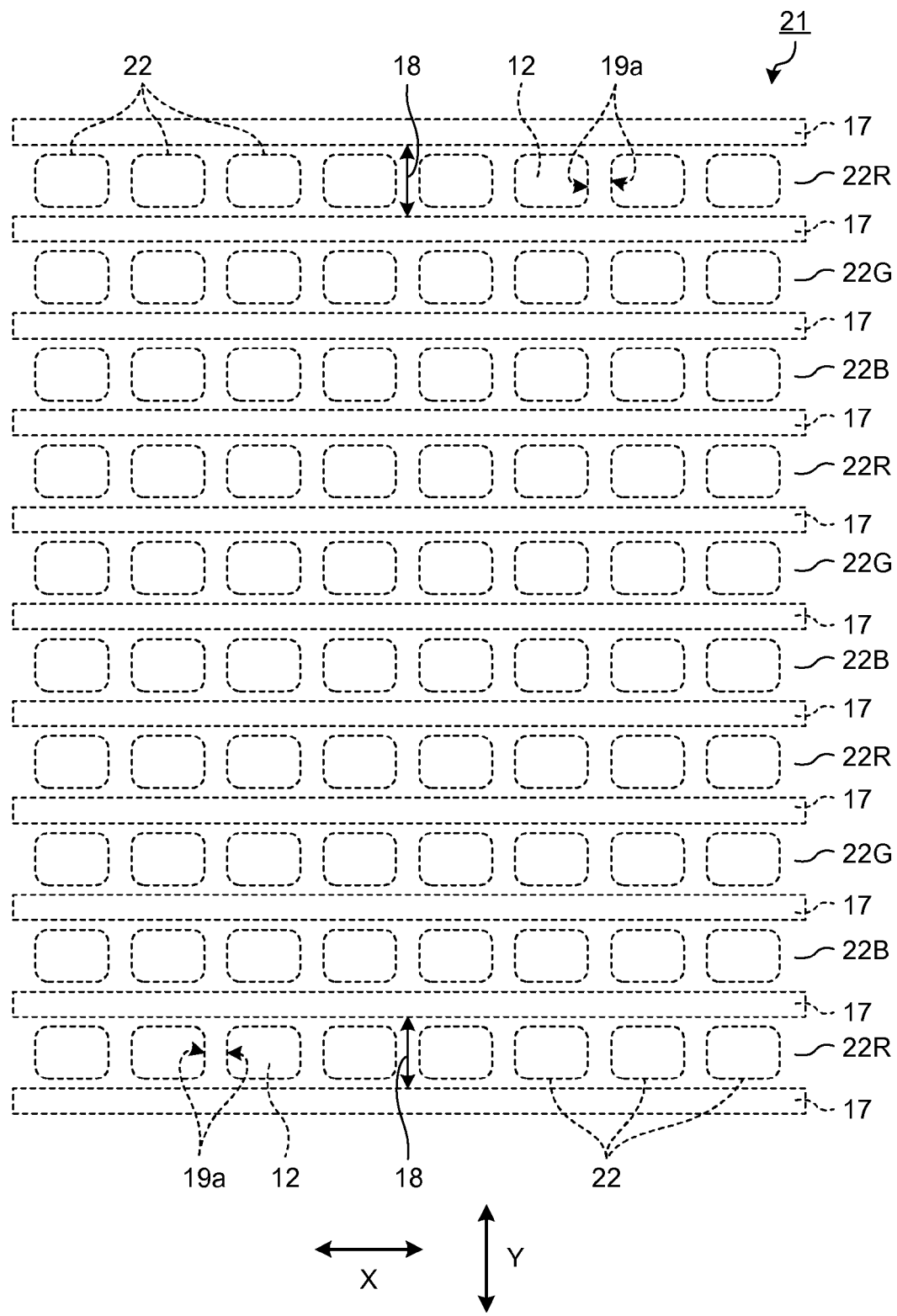
FIG. 2 is a plan view schematically illustrating the light-emitting device.

First, referring to FIG. 1 and FIG. 2, the composition of a light-emitting device of the present embodiment is described. In the descriptions below, the drawings merely illustrates the shape, the size and the position of each component schematically to the extent being capable of comprehending the present invention, and each drawing should not be construed as limiting the scope of the present invention. In the drawings, the same components are indicated by attaching the same symbol and duplicate explanations will be omitted in some cases.

FIG. 1 is a cross-sectional view schematically illustrating a light-emitting device. FIG. 2 is a plan view schematically illustrating a light-emitting device. A light-emitting device 21 is composed by including mainly a supporting substrate 11, a plurality of organic EL elements 22 formed on the supporting substrate 11, and a partition wall 17 for dividing the organic EL elements 22 on the supporting substrate 11.

A partition wall 17 is provided for dividing the organic EL elements 22 on the supporting substrate 11. The partition walls 17 are formed, for example, in a lattice pattern or a stripe pattern. In the present embodiment, the partition walls 17 are formed in a stripe pattern. That is, a plurality of the partition walls 17 extending in a line direction X are provided in a column direction Y with a predetermined interval on the supporting substrate 11. In the present embodiment, the line direction X and the column direction Y cross each other at right angles, and the line direction X and the column direction Y each crosses a thickness direction Z of the supporting substrate 11 at right angles. Hereinafter, a concave portion defined by a pair of partition walls 17 adjacent to each other in the column direction Y and the supporting substrate 11 and extending in the line direction is a concave portion 18. On the supporting substrate 11, a plurality of concave portions 18 are defined. Each concave portion 18 corresponds to each predetermined line.

In the present embodiment, between the supporting substrate 11 and the partition wall 17, an insulation film 19 is provided. The insulation film 19 is provided, for example, for obtaining electric insulation between the organic EL elements 22 adjacent to each other in the line direction X or in the column direction Y. The insulation film 19 is formed in a lattice pattern and is constituted by forming integrally a plurality of belts extending in the line direction X and a plurality of belt-shaped portions extending in the column direction.

An opening 19a of the insulation film 19 is formed at a position where the insulation film 19 is overlapped with the organic EL element viewed from a thickness direction of the supporting substrate 11 (hereinafter, also called "in a plan view").

The opening 19a of the insulation film 19 is formed, for example, in a substantially rectangular shape, an oval shape, a substantially circular shape, a substantially elliptical shape, or the like in a plan view. The lattice-patterned insulation film 19 is formed mainly in a region that excludes a first electrode 12 described below in a plan view, and a part thereof is formed so as to cover the periphery of the first electrode 12. The above-described a plurality of partition walls 17 are provided on a plurality of belt-like portions included in a part of the insulation film and extending in the line direction X.

In the present embodiment, the organic EL elements 22 are provided in a space (that is, the concave portion 18) between the partition walls 17 adjacent to each other in the column direction Y and are disposed at a predetermined interval in the line direction X in each space between the partition walls 17. That is, in the present embodiment, the organic EL elements 22 are arrayed in a matrix pattern on the supporting substrate 11. The organic EL elements 22 are arrayed providing a predetermined interval in the line direction X and also a predetermined interval in the column direction Y. The organic EL elements 22 are not necessary to be physically separated from each other and may be electrically insulated so that the organic EL elements 22 can individually be driven. Therefore, some layers (the electrodes and the hole injection layer described below) included in the organic EL element 22 may be physically connected with another organic EL element 22.

The organic EL element 22 includes a pair of electrodes including the first electrode 12 and a second electrode 16 and a light-emitting layer 15 provided between the electrodes.

The pair of electrodes composed of the first electrode 12 and the second electrode 16 are constituted by an anode and a cathode. That is, one of the first electrode 12 and the second electrode 16 is provided as the anode and the other is provided as the cathode. The first electrode 12 among the first electrode 12 and the second electrode 16 is disposed near the supporting substrate 11 and the second electrode 16 is disposed more distant from the supporting substrate 11 than the first electrode 12.

The organic EL element 22 may include not only one light-emitting layer 15, but also a plurality of light-emitting layers. Between the pair of electrodes, not only the light-emitting layer 15, but also, if necessary, a predetermined layer is provided. For example, between the anode and the light-emitting layer 15, the hole injection layer, the hole transport layer, the electron block layer and the like are provided; and between the light-emitting layer 15 and the cathode, the hole block layer, the electron transport layer, the electron injection layer and the like are provided.

The organic EL element 22 of the present embodiment includes, between the first electrode 12 and the light-emitting layer 15, a low resistance layer (also called a "first resistance layer") 13 formed by an applying method and a high resistance layer (also called a "second resistance layer") 14 having an electric resistance higher than that of the low resistance layer 13. Between the first electrode 12 and the low resistance layer 13, between the high resistance layer 14 and the light-emitting layer 15, and between the light-emitting layer 15 and the second electrode 16, if necessary, a predetermined layer may be provided.

Hereinafter, as one embodiment, an organic EL element 22 is described, which is constituted by stacking the first electrode 12 functioning as an anode, the low resistance layer 13 functioning as a hole injection layer, the high resistance layer 14 functioning as a hole transport layer, the light-emitting layer 15, the second electrode 16 functioning as a cathode in this order so that the first electrode 12 is located near the supporting substrate 11.

The light-emitting device 21 of the present embodiment is an active matrix driven-type device. Therefore, the first electrode 12 is individually provided for each organic EL element 22. That is, the same number of the first electrodes 12 as the organic EL elements 22 are provided on the supporting substrate 11. The first electrode 12 is formed, for example, in a plate shape and in a substantially rectangular shape in a plan view. The first electrodes 12 are provided in a matrix pattern corresponding to a position where each organic EL element 22 is provided on the supporting substrate 11. The first electrodes 12 are disposed providing a predetermined interval in the line direction X and also a predetermined interval in the column direction Y.

That is, the first electrodes 12 are provided in a space between the partition walls 17 adjacent to each other in the column direction Y in a plan view, and in each space between the partition walls 17, the first electrodes 12 are disposed at a predetermined interval in the line direction X.

As described above, the lattice-patterned insulation film 19 is formed mainly in a region that excludes the first electrode 12 in a plan view and a part thereof is formed so as to cover the periphery of the first electrode 12. That is, regarding the insulation film 19, the opening 19a for exposing a part of the first electrode 12 is formed. Through this opening 19a, a part of the surface of the first electrode 12 is exposed from the insulation film 19.

A low resistance layer 13 is disposed by extending in a region sandwiched between the partition walls 17 in the line direction X. That is, the low resistance layer 13 is formed in a belt-like form in the concave portion 18 defined by the partition walls 17 adjacent to each other in the column direction Y. The low resistance layer 13 is formed so as to straddle continuously over the organic EL elements 22 adjacent to each other in the line direction X.

The low resistance layer 13 has a creeping-up portion 13a creeping up to a direction that is away from the supporting substrate 11 and along the surface of the corresponding partition wall 17. In the present embodiment, because the stripe-patterned partition walls 17 are provided on the supporting substrate 11, both sides of the periphery portion in the column direction Y of the low resistance layer 13 are contacted with the partition walls 17, and the creeping-up portions 13a are formed at the both sides of the periphery portion in the column direction Y. Although in the present embodiment, the creeping-up portions 13a are formed at only both sides of the periphery portions in the column direction Y of the low resistance layer 13, when, for example, a lattice-patterned partition wall is provided and each organic EL element is individually divided by the partition wall, all the periphery portion of the low resistance layer is contacted with the partition wall, and therefore a low resistance layer has a creeping-up portion at all the periphery portion.

A high resistance layer 14 is provided so as to straddle continuously over one organic EL element 22 to another organic EL element 22 that are adjacent to each other with the partition wall 17 interposed therebetween. In other words, the high resistance layer 14 is formed by covering the partition wall 17 separating one organic EL element 22 from another organic EL element 22. That is, the high resistance layer 14 is formed so as to integrally range all over the surfaces of the low resistance layers 13 and exposed surfaces out of the low resistance layers 13 among the surfaces of the partition walls 17. Thus, the high resistance layer 14 is formed by covering the partition walls 17, and thereby the creeping-up portions 13a of the low resistance layers 13 are covered by the high resistance layer 14. Therefore, the second electrode 16 (cathode) that is formed after the high resistance layer 14 is formed and the low resistance layer 13 can be separated from each other to prevent the electrode 16 and the layer 13 from being physically connected with each other.

It is preferable that an electric resistance of the high resistance layer 14, that is an electric resistivity, is at least higher than the electric resistivity of the low resistance layer 13. The electric resistivity of the high resistance layer 14 is, for example, preferably 10 or more times, and further preferably 100 or more times as high as the electric resistivity of the low resistance layer 13. The upper limit of the electric resistivity of the high resistance layer 14 is set as appropriate, taking into consideration a film thickness of the high resistance layer 14 and characteristics of the organic EL element 22.

A light-emitting layer 15 is disposed by extending in a region that is sandwiched by the partition walls 17 to the line direction X. That is, the light-emitting layer 15 is formed in a concave portion 18 defined by the partition walls 17 adjacent to each other in the column direction Y in a belt shape, and is formed so as to straddle continuously over the organic EL elements 22 adjacent to each other in the line direction X.

In the case of a color display device, three types of organic EL elements 22 are provided on the supporting substrate 11, which emit any one type of light among red light, green light and blue light. A color display device may be achieved, for example, by arraying repeatedly the following lines (I), (II), and (III) in this order in the column direction Y.

(I) A line in which a plurality of organic EL elements 22R emitting red light are arrayed at a predetermined interval.
(II) A line in which a plurality of organic EL elements 22G emitting green light are arrayed at a predetermined interval.
(III) A line in which a plurality of organic EL elements 22B emitting blue light are arrayed at a predetermined interval.

Thus, when a plurality of types of organic EL elements emitting different color lights are formed, a light-emitting layer emitting a different color light is provided for each type of the organic EL element emitting a different color light. In the present embodiment, the following lines (i), (ii) and (iii) in which three types of light-emitting layers 15R, 15G and 15B are respectively provided are repeatedly arrayed in this order in the column direction Y.

Three types of the lines are:
(i) a line in which a light-emitting layer 15R emitting red light is provided;
(ii) a line in which a light-emitting layer 15G emitting green light is provided; and
(iii) a line in which a light-emitting layer 15B emitting blue light is provided.

That is, the belt-shape light-emitting layers 15R, 15G and 15B extending to the line direction X are sequentially stacked individually on the high resistance layer 14 with an interval of two lines to the column direction Y.

A second electrode 16 is provided on the light-emitting layer 15. In the present embodiment, the second electrode 16 is formed continuously over the organic EL elements 22 and is provided as a common electrode to these organic EL elements 22. That is, the second electrode 16 is formed not only on the light-emitting layer 15, but also on the partition walls 17, so as to extend over an electrode on the light-emitting layer 15 and an electrode on the partition wall 17.

<Production Method of Light-Emitting Device>

Next, a production method of a light-emitting device is described.

(Process for Preparing Supporting Substrate Provided with Partition Wall and First Electrode)

First, a supporting substrate 11 is prepared. In case of an active matrix driven-type display device, as the supporting substrate 11, a substrate in which a circuit for driving individually a plurality of organic EL elements is formed beforehand, may be used. For example, a substrate on which a thin film transistor (TFT) is formed beforehand may be used as the supporting substrate.

Next, on the prepared supporting substrate 11, a plurality of first electrodes 12 are formed in a matrix pattern. The first electrodes 12 are formed, for example: a conductive thin film is formed all over on the supporting substrate 11; and then the conductive thin film is patterned in a matrix pattern by a photolithography method (in the description below, the "photolithography method" includes a patterning process such as an etching process performed following a mask pattern forming process). Also, the first electrodes 12 may be formed to be patterned, for example: a mask in which an opening is formed in a certain portion is arranged on the supporting substrate 11; and then a conductive material is stacked selectively at a predetermined area on the supporting substrate 11 through the mask pattern. A material for the first electrodes 12 is described below. In the present process, a substrate in which the first electrodes 12 are formed beforehand may be prepared as the supporting substrate 11.

Next, in the present embodiment, the partition walls 17 are formed in a stripe pattern on the supporting substrate 11. The partition wall 17 is composed of an organic substance or an inorganic substance. Examples of the organic substance constituting the partition wall 17 may include resins such as an acrylic resin, a phenolic resin, and a polyimide resin. Examples of the inorganic substance constituting the partition wall 17 may include $SiO_x$ and $SiN_x$.

When the partition walls 17 composed of an organic substance are formed, first, for example, a positive or negative photosensitive resin is applied all over to the substrate and a predetermined portion is exposed and developed. And then, by curing the resultant coating, the partition walls 17 are formed in a stripe pattern. As the photosensitive resin, a photoresist may be used. When the partition walls 17 composed of an inorganic substance are formed, a thin film containing an inorganic substance is formed all over the substrate by a plasma CVD method, a sputtering method, or the like. Next, by removing a predetermined portion of the thin film, the partition walls 17 are formed in a stripe pattern. A predetermined portion is removed, for example, by a photolithography method.

When producing a light-emitting device 21 having an insulation film 19 in a lattice pattern, the insulation film 19 is formed before the process of forming the partition wall 17. The insulation film 19 may be formed in a lattice pattern by using, for example, a material indicated in the example of the material for the partition wall 17 in the same manner as that of forming the partition wall 17.

The shape and the arrangement of the partition wall 17 are set as appropriate according to the specifications of a display device such as the number of pixels and the resolution and the easiness of the production.

For example, a width L1 of each of the partition walls 17 in the column direction Y is about 5 µm to 50 µm. The height L2 of the partition wall 17 is about 0.5 µm to 5 µm. An interval L3 between the partition walls 17 adjacent to each other in the column direction Y, that is, a width L3 of a concave portion 18 in the column direction Y is about 10 µm to 200 µm. The widths of each of the first electrodes 12 in the line direction X and the column direction Y are respectively about 10 µm to 400 µm.

(Process for Forming a Low Resistance Layer)

In the present process, ink including a material to be the low resistance layer 13 is supplied to a space between the partition walls 17 and is solidified to form the low resistance layer 13. In the present embodiment, in order to form the low resistance layer 13 functioning as a hole injection layer, ink including a material to be the hole injection layer is supplied to a space between the partition walls 17 and is solidified to form the low resistance layer 13.

As a method of supplying the ink to a space between the partition walls 17, any method may be employed so long as the method is an applying method capable of supplying ink selectively to a space between the partition walls 17. Examples of such a method may include a predetermined printing method such as a nozzle printing method, an inkjet method, and a flexo printing method.

As in the present embodiment, when the ink is supplied to the concave portion 18 that is a space between the partition walls 17 having a stripe pattern, a predetermined printing method such as a nozzle printing method and a flexo printing method is preferred, and a nozzle printing method is more preferred.

In the nozzle printing method, ink is supplied to each line (concave portion 18) by one-stroke sketch. That is, while discharging liquid columnar ink through a nozzle disposed over the supporting substrate 11 and reciprocating the nozzle in the line direction X, and at the turn of the reciprocation of the nozzle, the supporting substrate 11 is moved by only one line to the column direction Y, and thereby the ink is supplied to each line. The method is not limited to the method in which the ink is supplied sequentially to each line as in the present embodiment and ink may be supplied with a predetermined interval of lines. In this case, the ink is supplied to all the lines dividedly in several times.

A low resistance layer 13 is formed by solidifying the ink supplied in the concave portion 18 between the partition walls 17. The solidification of the ink may be performed, for example, by removing the solvent. The removal of the solvent may be performed by natural drying, heating drying, vacuum drying, or the like. When ink contains a material to be polymerized by applying energy such as light or heat, the low resistance layer 13 may be solidified by applying energy such as light or heat after the ink is supplied.

Figure 3:
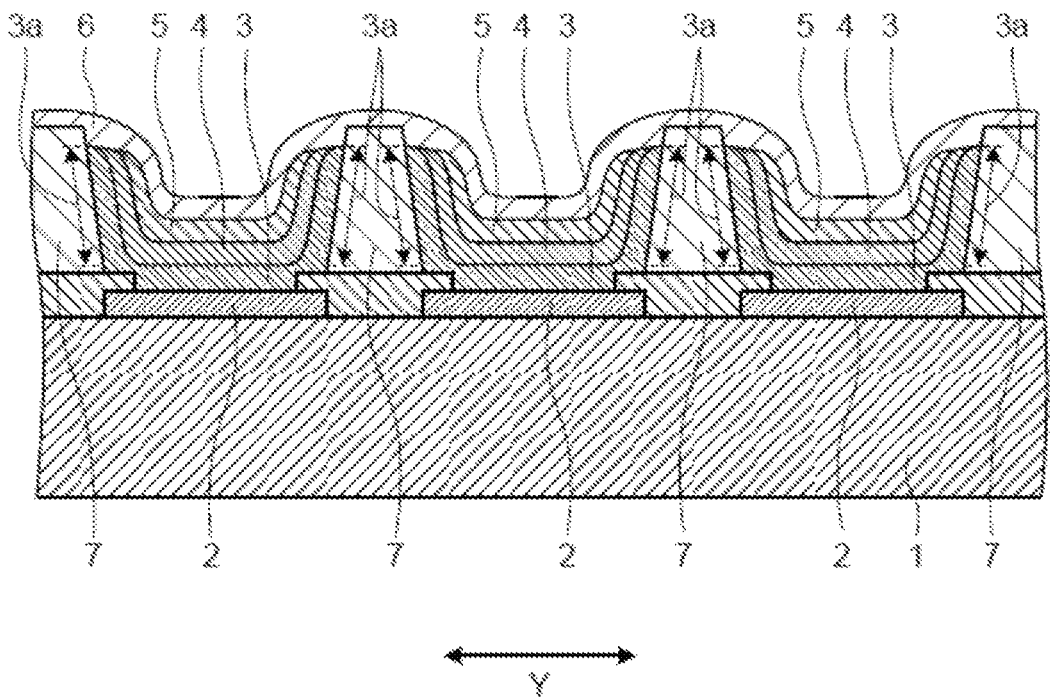
FIG. 3 is a cross-sectional view schematically illustrating a conventional light-emitting device.

When the ink supplied to a region divided by the partition wall 17 is solidified while being spread in a wet state on a side face of the partition wall 17, as illustrated in FIG. 3, the creeping-up portion 13a creeping up to a direction that is away from the supporting substrate 11 and along the side face of the partition wall 17 is formed in a peripheral portion of the low resistance layer 13.

(Process for Forming a High Resistance Layer)

In the present process, first, so as to make the ink spread all over the regions (for example, all over the exposed surface) in which the organic EL elements 22 should be formed, ink including a material to be the high resistance layer 14 is supplied to all the regions. Examples of a method for such supplying the ink to all the regions include a spin coating method, a slit coating method, and a CAP coating method. The high resistance layer 14 may be formed not only by an applying method, but also by a predetermined dry method such as an evaporation method and a sputtering method.

A high resistance layer 14 is formed by solidifying the ink supplied to a space between the partition walls 17. The solidification of the ink may be performed, for example, by removing the solvent. The removal of the solvent may be performed by natural drying, heat drying, vacuum drying, or the like. When the ink for using includes a material to be polymerized by applying energy such as light or heat, the high resistance layer 14 may be formed by solidifying the ink by applying energy such as light or heat after the ink is supplied.

Thus, by applying ink to all regions and further by solidifying the ink, a high resistance layer is formed so as to straddle continuously over one organic EL element to another organic EL element that are adjacent to each other with the partition wall interposed therebetween.

(Process for Forming a Light-Emitting Layer)

Next, a light-emitting layer 15 is formed. As described above, when a color display device is produced, in order to produce three types of organic EL elements 22, each line is necessary to be applied in different colors using a material for the light emitting layer 15. For example, when three light-emitting layers 15 are formed respectively for each line, it is necessary to apply red ink including a material emitting red light, green ink including a material emitting green light, and blue ink including a material emitting blue light, to each column respectively with an interval of two columns in the column direction Y. Then, by applying red ink, green ink, and blue ink sequentially to a predetermined line respectively, each light-emitting layer 15 (15R, 15G and 15B) may be applied to form a film. Examples of a method of applying red ink, green ink and blue ink sequentially to a predefined line may include predetermined applying methods such as a printing method, an inkjet method, and a nozzle printing method. For example, with regard to using the nozzle printing method, according to the same manner as the above-described method for forming the low resistance layer 13, the ink may be applied.

For example, while discharging liquid columnar red ink through a nozzle disposed over the supporting substrate 11 and reciprocating the nozzle in the line direction X, and at the turn of the reciprocation of the nozzle, the supporting substrate 11 is moved by three lines to the column direction Y, and thereby the red ink may be supplied at an interval of two lines. With regard to supplying green ink or blue ink, it may be performed in the same manner as that of red ink.

A light-emitting layer 15 may be formed by solidifying the ink supplied to a space between the partition walls 17. The solidification of the ink may be performed, for example, by removing the solvent. The removal of the solvent may be performed by natural drying, heat drying, vacuum drying, or the like. When the ink for using includes a material to be polymerized by applying energy such as light or heat, the light-emitting layer 15 may be formed by solidifying the ink by applying energy such as light or heat after the ink is supplied.

After the light-emitting layer 15 is formed, if necessary, a predefined organic layer, inorganic layer, and the like are formed by a predetermined method. These layers may be formed by using a predetermined applying method such as a printing method, an inkjet method, and a nozzle printing method and further, a predetermined dry method such as an evaporation method and a sputtering method.

(Process for Forming a Second Electrode)

Next, a second electrode 16 is formed. As described above, in the present embodiment, the second electrode 16 is formed all over the supporting substrate 11 (all over the exposed surface). By forming the second electrode 16, a plurality of the organic EL elements 22 may be formed on the supporting substrate 11.

In the above-described light-emitting device 21, the creeping-up portion 13a of the low resistance layer 13 is covered with the high resistance layer 14 having an electric resistivity higher than that of the low resistance layer 13. Therefore, the low resistance layer 13 and the second electrode 16 can be prevented from being physically connected with each other. In a conventional light-emitting device, a leakage current flowing along a side face of the partition wall is easily generated. However, in the organic EL element 22 (light-emitting device 21) of the present embodiment, because the high resistance layer 14 is interposed between the low resistance layer 13 and the second electrode 16, a leakage current flowing along the side face of the partition wall 17 can be prevented.

<Composition of Organic EL Element>

As described above, the organic EL element 22 may employ various layers compositions, and hereinafter the layer structure of the organic EL element 22, the composition of each layer, and the forming method of each layer are described more in detail.

As described above, an organic EL element 22 is composed by including a pair of electrodes and one or a plurality of organic layer(s) provided between the electrodes and has at least one light-emitting layer 15 as one or a plurality of organic layer(s). The organic EL element 22 may include a layer including an inorganic substance and an organic substance, an inorganic layer, and the like. The organic substance included in the organic layer may be a low molecular compound, a macromolecular compound, or a mixture of a low molecular compound and a macromolecular compound. The organic layer includes preferably a macromolecular compound and includes preferably a macromolecular compound having a number average molecular weight in terms of polystyrene of $10^3$ to $10^8$.

Examples of the layer(s) provided between a cathode and a light-emitting layer 15 may include an electron injection layer, an electron transport layer, and a hole block layer. When both the electron injection layer and the electron transport layer are provided between the cathode and the light-emitting layer 15, a layer near the cathode is called an "electron injection layer" and a layer near the light-emitting layer 15 is called an "electron transport layer". Examples of the layers provided between an anode and a light-emitting layer 15 may include a hole injection layer, a hole transport layer and an electron block layer. When both of the hole injection layer and the hole transport layer are provided, a layer near the anode is called a "hole injection layer" and a layer near the light-emitting layer 15 is called a "hole transport layer".

Examples of the element composition of an organic EL element 22 are illustrated as follows.

a) anode/hole injection layer/light-emitting layer/electron transport layer/electron injection layer/cathode;
b) anode/hole transport layer/light-emitting layer/electron transport layer/electron injection layer/cathode;
c) anode/hole injection layer/hole transport layer/light-emitting layer/cathode;
d) anode/hole injection layer/hole transport layer/light-emitting layer/electron injection layer/cathode;
e) anode/hole injection layer/hole transport layer/light-emitting layer/electron transport layer/cathode;
f) anode/hole injection layer/hole transport layer/light-emitting layer/electron transport layer/electron injection layer/cathode;
g) anode/light-emitting layer/electron transport layer/electron injection layer/cathode.

Here, the symbol "/" indicates that the layers at both sides of the symbol "/" are layered adjacent to each other. The same applies to the description below.

Furthermore, the light-emitting layer may have two or more light-emitting layers, or may have two or more light-emitting layers and constitute a so-called multiphoton-type element in which an electric charge generating layer for generating an electric charge is interposed between the light-emitting layers.

An organic EL element may be further covered by a sealing member such as a sealing film or a sealing plate for sealing.

An order of stacking layers, a number of layers, and a thickness of each layer may be set as appropriate, taking into consideration light-emitting efficiency and element life. In an organic EL element 22, among the anode and the cathode, the anode may be arranged at a position near the supporting substrate 11 and the cathode may be arranged at a position distant from the supporting substrate. On the contrary, the cathode may be arranged at a position near the supporting substrate 11 and the anode may be arranged at a position distant from the supporting substrate 11. For example, regarding the above compositions c) to f), the first electrode 12 may be set as an anode and each layer from the left end may be stacked in order on the supporting substrate 11; or on the contrary, regarding the compositions a), b), f), and g), the first electrode 12 may be set as a cathode and each layer from the right end may be stacked in order on the supporting substrate 11.

Next, materials and a forming method of each layer constituting the organic EL element 22 are more specifically described.

<Anode>

In the case of an organic EL element 22 having a composition in which light emitted from a light-emitting layer 15 is emitted through an anode, an electrode having optical transparency is used for an anode. As the electrode having optical transparency is used, a thin film of a metal oxide, a metal sulfide or a metal which have a high electric conductivity may be used and a material having a high light transmittance is preferably used. As examples for the electrode having optical transparency, the following are used: a thin film composed of indium oxide, zinc oxide, tin oxide, indium tin oxide (ITO), indium zinc oxide (IZO), gold, platinum, silver, copper or the like. And among them, a thin film composed of ITO, IZO, or tin oxide is preferably used. Examples of a production method of an anode may include a vacuum evaporation method, a sputtering method, an ion plating method, and a plating method. As the anode, an organic transparent conductive film of a polyamine or derivatives thereof, a polythiophene or derivatives thereof, or the like may be used.

In the case of an organic EL element 22 having a composition in which a light emitted from the light-emitting layer 15 is emitted through a cathode, for an anode, a material that reflects light may be used and the material reflecting light is preferably a metal, a metal oxide, or a metal sulfide which has a work function of 3.0 eV or more.

A film thickness of an anode may be selected as appropriate, taking into consideration optical transparency and electric resistance. A film thickness of the anode is, for example 10 nm to 10 μm, preferably 20 nm to 1 μm, and further preferably 50 nm to 500 nm.

<Hole Injection Layer>

Examples of a hole injection material constituting the hole injection layer may include: oxides such as vanadium oxide, molybdenum oxide, ruthenium oxide, and aluminum oxide; phenylamine compounds; star burst-type amine compounds; phthalocyanine compounds; amorphous carbon; polyaniline; and polythiophene derivatives.

Examples of a film-forming method of the hole injection layer may include film forming from a solution containing a hole injection material. A solvent of the solution used for film forming from the solution is not particularly limited so long as the solvent is a solvent capable of dissolving the hole injection material. Examples thereof may include: chlorinated solvents such as chloroform, methylene chloride, and dichloroethane; ether solvents such as tetrahydrofuran; aromatic hydrocarbon solvents such as toluene and xylene; ketone solvents such as acetone and methyl ethyl ketone; ester solvents such as ethyl acetate, butyl acetate, and ethylcellosolve acetate; and water.

Examples of the film-forming method from the solution may include applying methods such as a spin coating method, a casting method, a micro gravure coating method, a gravure coating method, a bar coating method, a roll coating method, a wire bar coating method, a dip coating method, a spray coating method, a screen printing method, a flexo printing method, an off-set printing method, an inkjet printing method, and a nozzle printing method. A hole injection layer is preferably formed by the above-described nozzle printing method.

A film thickness of a hole injection layer is set as appropriate, taking into consideration electric characteristics and easiness of film forming. A film thickness of the hole injection layer is, for example 1 nm to 1 μm, preferably 2 nm to 500 nm, and further preferably 5 nm to 200 nm.

<Hole Transport Layer>

Examples of a hole transport material constituting the hole transport layer may include a polyvinyl carbazole or derivatives thereof, a polysilane or derivatives thereof, a polysiloxane derivative having an aromatic amine at a side chain or a main chain, a pyrazoline derivative, an arylamine derivative, a stilbene derivative, a triphenyldiamine derivative, a polyaniline or derivatives thereof, a polythiophene or derivatives thereof, a polyarylamine or derivatives thereof, a polypyrrole or derivatives thereof, poly(p-phenylenevinylene) or derivatives thereof, and poly(2,5-thienylenevinylene) or derivatives thereof.

Among these hole transport materials, preferred materials are macromolecular hole transport materials such as a polyvinyl carbazole or derivatives thereof, a polysilane or derivatives thereof, a polysiloxane derivative having an aromatic amine compound group at a side chain or a main chain, a polyaniline or derivatives thereof, a polythiophene or derivatives thereof, a polyarylamine or derivatives thereof, poly(p-phenylenevinylene) or derivatives thereof, and poly(2,5-thienylenevinylene) or derivatives thereof, and further preferred materials are a polyvinyl carbazole or derivatives thereof, a polysilane or derivatives thereof, and a polysiloxane derivative having aromatic amine at a side chain or a main chain. When using a low molecular hole transport material, it is preferable to disperse in a macromolecular binder for using.

A film-forming method of the hole transport layer is not particularly limited. When using a low molecular hole transport material, examples of the film-forming method may include a film forming from a mixture containing a macromolecular binder and a hole transport material. When using a macromolecular hole transport material, examples of the film-forming method using may include a film forming from a solution containing a hole transport material.

The solvent of the solution used for film forming from the solution is not particularly limited so long as the solvent is a solvent capable of dissolving the hole transport material. For example, as a solvent, the solvent of the solution used for film-forming the hole injection layer from a solution is included.

Examples of the film-forming method from a solution may include the same applying methods as the above-described film-forming method of the hole injection layer. The hole transport layer may be formed by the above-described spin coating method.

As the macromolecular binder to be mixed, a binder that does not extremely inhibit electric charge transport is preferred, and a macromolecular binder that weakly absorbs visible light is preferably used. Examples of such a macromolecular binder may include a polycarbonate, a polyacrylate, a polymethyl acrylate, a polymethyl methacrylate, a polystyrene, a polyvinyl chloride, and a polysiloxane.

A film thickness of the hole transport layer is set as appropriate, taking into consideration electric characteristics and easiness of film forming. A film thickness of the hole transport layer is, for example, 1 nm to 1 µm, preferably 2 nm to 500 nm, and further preferably 5 nm to 200 nm.

<Light-Emitting Layer>

A light-emitting layer 15 is usually composed of mainly an organic substance emitting fluorescence and/or phosphorescence, or this organic substance and a dopant assisting the organic substance. The dopant is added, for example, for enhancing light-emitting efficiency or changing a light-emitting wavelength. The organic substance may be a low molecular compound or a macromolecular compound. The light-emitting layer 15 contains preferably a macromolecular compound having a number average molecular in terms of polystyrene of $10^3$ to $10^8$. Examples of a light-emitting material constituting the light-emitting layer 15 may include a dye material, a metal complex material, a macromolecular material, and a dopant material, described below.

(Dye Materials)

Examples of the dye material may include cyclopentamine derivatives, tetraphenylbutadiene derivatives, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, oxadiazole dimers, pyrazoline dimers, quinacridone derivatives, and coumarin derivatives.

(Metal Complex Materials)

Examples of the metal complex material may include a metal complexe having as a central metal, a rare metal such as Tb, Eu, and Dy, or Al, Zn, Be, Ir, or Pt and having as a ligand, an oxadiazole, thiadiazole, phenylpyridine, phenylbenzimidazole, or quinoline structure. Specific examples thereof may include a metal complexe having light-emitting from a triplet excited state such as an indium complex and a platinum complexe, an aluminum-quinolinole complexe, a benzoquinolinol-beryllium complexe, a benzoxazolyl-zinc complexe, a benzothiazole-zinc complexe, an azomethyl-zinc complexe, a porphyrin-zinc complexe, and a phenanthroline-europium complexe.

(Macromolecular Materials)

Examples of the macromolecular materials may include materials prepared by polymerizing a poly-p-phenylenevinylene derivative, a polythiophene derivative, a poly-p-phenylene derivative, a polysilane derivative, a polyacetylene derivative, a polyfluorene derivative, a polyvinylcarbazole derivative, the above dye materials, or a macromolecular one obtained from a metal complex material.

Among the above light-emitting materials, examples of the material emitting blue light may include distyrylarylene derivatives, oxadiazole derivatives, polymers of these derivatives, polyvinylcarbazole derivatives, poly-p-phenylene derivatives, and polyfluorene derivatives. Among them, preferred materials are macromolecular materials such as polyvinylcarbazole derivatives, poly-p-phenylene derivatives, and polyfluorene derivatives.

Examples of the material emitting green light may include quinacridone derivatives, coumarin derivatives, polymers of these derivatives, poly-p-phenylenevinylene derivatives, and polyfluorene derivatives. Among them, preferred materials are macromolecular materials such as poly-p-phenylenevinylene derivatives and polyfluorene derivatives.

Examples of the material emitting red light may include coumarin derivatives, thiophene ring compounds, polymers of these compounds, poly-p-phenylenevinylene derivatives, polythiophene derivatives, and polyfluorene derivatives. Among them, preferred materials are macromolecular materials such as poly-p-phenylenevinylene derivatives, polythiophene derivatives, and polyfluorene derivatives.

(Dopant Materials)

Examples of the dopant material may include perylene derivatives, coumarin derivatives, rubrene derivatives, quinacridone derivatives, squarylium derivatives, porphyrin derivatives, styryl dyes, tetracene derivatives, pyrazolone derivatives, decacyclene, and phenoxazone. A thickness of such a light-emitting layer is usually 2 nm to 200 nm.

Examples of the film-forming method of the light-emitting material may include a printing method, an inkjet printing method, and a nozzle printing method. For example, as described above, according to the nozzle printing method, a plurality of ink types may be applied to be divided.

<Electron Transport Layer>

As an electron transport material constituting the electron transport layer, a publicly-known electron transport material may be used. Examples of the electron transport material may include oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, a metal complex of 8-hydroxyquinoline or derivatives thereof, a polyquinoline or derivatives thereof, a polyquinoxaline or derivatives thereof, and a polyfluorene or derivatives thereof.

Among them, as the electron transport material, preferred materials are oxadiazole derivatives, benzoquinone or derivatives thereof, anthraquinone or derivatives thereof, a metal complex of 8-hydroxyquinoline or derivatives thereof, a polyquinoline or derivatives thereof, a polyquinoxaline or derivatives thereof, and a polyfluorene or derivatives thereof, and further preferred materials are 2-(4-biphenylyl)-5-(4-tert-butylphenyl)-1,3,4-oxadiazole, benzoquinone, anthraquinone, tris(8-quinolinol) aluminum, and polyquinoline.

A film-forming method of the electron transport layer is not particularly limited. When using a low molecular electron transport material, examples of the film-forming method may include a vacuum evaporation method from powder, or a film forming from a solution or a molten state. When using a macromolecular electron transport material, examples of the film-forming method may a include film forming from a solution or a molten state. When forming a film from a solution or a molten state, a macromolecular binder may be used in combination. Examples of the film-forming method from a solution may include the same applying methods as the above-described film-forming method of the hole injection layer.

A film thickness of the electron transport layer is set as appropriate, taking into consideration electric characteristics and easiness of film forming. A film thickness of the electron transport layer is, for example 1 nm to 1 μm, preferably 2 nm to 500 nm, and further preferably 5 nm to 200 nm.

<Electron Injection Layer>

As a material constituting the electron injection layer, an appropriate material is selected as appropriate according to the type of the light-emitting layer 14. Examples of a material constituting the electron injection layer may include an alkali metal, an alkaline earth metal, an alloy containing one or more type(s) of an alkali metal and an alkaline earth metal, an oxide of an alkali metal or an alkaline earth metal, a halide of an alkali metal or an alkaline earth metal, a carbonate of an alkali metal or an alkaline earth metal, and a mixture of these substances. Examples of the alkali metal, the oxide of an alkali metal, the halide of an alkali metal, and the carbonate of the alkali metal may include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, and lithium carbonate. Examples of the alkaline earth metal, the oxide of an alkaline earth metal, the halide of an alkaline earth metal, and the carbonate of an alkaline earth metal may include magnesium, calcium, barium, strontium, magnesium oxide, magnesium fluoride, calcium oxide, calcium fluoride, barium oxide, barium fluoride, strontium oxide, strontium fluoride, and magnesium carbonate. The electron injection layer may be constituted with a layered body prepared by stacking two or more layers and examples thereof may include LiF/Ca. The electron injection layer is formed by an evaporation method, a sputtering method, a printing method, or the like. A film thickness of the electron injection layer is preferably around 1 nm to 1 μm.

<Cathode>

A material for a cathode is preferably a material having a small work function and a high electric conductivity and capable of easily injecting electrons into the light-emitting layer 15. In an organic EL element 22 having a structure in which light is retrieved from the side of an anode, light emitted from the light-emitting layer 15 is reflected on the cathode to the anode, and therefore, the material for a cathode is preferably a material having a high visible light reflectivity. Examples of the materials for a cathode may include an alkali metal, an alkaline earth metal, a transition metal, and a metal of Group 13 in the Periodic Table. Specific examples of the materials for a cathode may include: metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium; alloys of two or more types of these metals; alloys of one or more type(s) of these metals with one or more type(s) of gold, silver, platinum, copper, manganese, titanium, cobalt, nickel, tungsten, and tin; and a graphite or a graphite intercalation compound. Examples of the alloys may include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy. As the cathode, a transparent conductive electrode containing a conductive metal oxide and a conductive organic substance may be used. Specific examples of the conductive metal oxides may include indium oxide, zinc oxide, tin oxide, ITO, and IZO. Specific examples of the conductive organic substances may include a polyaniline or derivatives thereof and a polythiophene or derivatives thereof. A cathode may be constituted by a layered body prepared by stacking two or more layers. An electron injection layer may be used as the cathode.

A film thickness of the cathode is set as appropriate, taking into consideration electric conductivity and durability. A film thickness of the cathode is, for example 10 nm to 10 μm, preferably 20 nm to 1 μm, further preferably 50 nm to 500 nm.

Examples of a production method of the cathode may include a vacuum evaporation method, a sputtering method, and a laminate method for thermocompression-bonding a metal thin film.

EXPLANATIONS OF LETTERS OR NUMERALS 1, 11 Supporting substrate
2 Anode
3 Hole injection layer
3a, 13a Creeping-up portion
4 Hole transport layer
5,15 Light-emitting layer
6 Cathode
7, 17 Partition wall
12 First electrode (anode)
13 Low-resistance layer (Hole injection layer)
14 High-resistance layer (Hole transport layer)
16 Second electrode (cathode)
18 Concave portion
19 Insulation film
19a Opening
21 Light-emitting device
22 Organic EL element

The invention claimed is:
1. A light-emitting device comprising:
a supporting substrate;
a partition wall for dividing a plurality of organic electroluminescent elements on the supporting substrate;
the plurality of organic electroluminescent elements provided in a concave portion that is a space between the partition walls; and an insulation film provided between the supporting substrate and the partition wall, wherein, each of the organic electroluminescent elements is composed by disposing a first electrode, a first resistance layer, a second resistance layer having an electric resistance higher than that of the first resistance layer, a light-emitting layer and a second electrode, in this order so that the first electrode is located near the supporting substrate;

the first resistance layer is provided entirely inside of the concave portion between the partition walls and does not straddle over the partition walls, and comprises a creeping-up portion and a first portion, the creeping-up portion creeping up to a direction that is away from the supporting substrate and along a surface of the partition wall; and the second resistance layer is directly in contact with the creeping-up portion and is provided so as to cover the creeping-up portion and straddle continuously over one organic electroluminescent element to another organic electroluminescent element that are adjacent to each other with the partition wall interposed therebetween, wherein the creeping-up portion has a height greater than a height of the first portion, and the first resistance layer is directly in contact with the partition wall.

2. A method for producing the light-emitting device according to claim 1, comprising the steps of:

preparing the supporting substrate provided with the partition wall and the first electrode;

forming the first resistance layer by supplying an ink comprising a material to be the first resistance layer to the concave portion and solidifying the ink;

forming the second resistance layer by supplying an ink comprising a material to be the second resistance layer to all regions in which the organic electroluminescent elements are to be formed so that the ink straddles over all the regions and solidifying the ink;

forming the light-emitting layer; and forming the second electrode.

3. The method for producing the light-emitting device according to claim 2, wherein the step of forming the first resistance layer is performed by a nozzle printing method.

4. The light-emitting device according to claim 1, wherein the first resistance layer forms a U-shape.

* * * * *